United States Patent
Mano (10) Patent No.: US 6,816,715 B1
(45) Date of Patent: Nov. 9, 2004

(54) WIDEBAND RECEIVER AND CHANNEL SCANNING METHOD

(75) Inventor: Hiroshi Mano, Hohya (JP)

(73) Assignee: AOR, Ltd., Tokyo (JP)

( * ) Notice: Subject to any disclaimer, the term of this patent is extended or adjusted under 35 U.S.C. 154(b) by 0 days.

(21) Appl. No.: 09/807,016

(22) PCT Filed: Oct. 5, 1998

(86) PCT No.: PCT/JP98/04489

§ 371 (c)(1),
(2), (4) Date: May 15, 2001

(87) PCT Pub. No.: WO00/21206

PCT Pub. Date: Apr. 13, 2000

(51) Int. Cl.[7] ............................................. H04B 1/18
(52) U.S. Cl. ................................. 455/161.3; 455/164.1
(58) Field of Search ........................ 455/161.1, 161.2, 455/161.3, 434, 226.1, 226.2, 130, 164.1, 164.2; 375/316

(56) References Cited

U.S. PATENT DOCUMENTS

| | | | | |
|---|---|---|---|---|
| 6,038,433 A | * | 3/2000 | Vegt | 455/161.1 |
| 6,434,186 B2 | * | 8/2002 | Dowling | 375/147 |

FOREIGN PATENT DOCUMENTS

| | | |
|---|---|---|
| JP | 07-087032 | 3/1995 |
| JP | 08-228163 | 3/1996 |
| JP | 08-228188 | 3/1996 |
| JP | 09-214450 | 8/1997 |
| JP | 09-219655 | 8/1997 |
| JP | 09-284191 | 10/1997 |
| JP | 09-51880 | 11/1997 |
| JP | 10-041839 | 2/1998 |

* cited by examiner

*Primary Examiner*—Nguyen T. Vo
*Assistant Examiner*—Farima Farkhondar
(74) *Attorney, Agent, or Firm*—Fulwider Patton Lee & Utecht, LLP (57) ABSTRACT

A wideband receiver (10) comprises a frequency converter (16) for converting the frequency of a signal inputted through an antenna (12) by using a local oscillation signal from a local oscillator (18); a wideband filter (20) for receiving the output of the frequency converter (16) and passing a signal component corresponding to the scanning band including the bands of channels; an A/D converter (22) for converting the output of the wideband filter (20) into a digital signal; an FFT operational circuit (24) for receiving the digital signal and subjecting it to high-speed Fourier transformation; and a control circuit (26) for detecting the channel in communication in a predetermined scanning band on the basis of the results of operation of the FFT operational circuit. The control circuit (26) repeats the change of the scanning band by changing the frequency of the local oscillation signal, to detect the channel in communication with an assigned frequency range, i.e., a search frequency range.

8 Claims, 5 Drawing Sheets

WIDEBAND RECEIVER AND CHANNEL SCANNING METHOD

This application is a 371 of PCT/JP 98/04489 filed on Oct. 5, 1998.

TECHNICAL FIELD

The present invention relates to a wideband receiver, referred to as a so-called scanner, and more specifically, relates to a wideband receiver and a channel scanning method, which can detect a channel at a higher speed.

BACKGROUND ART

Figure 1:
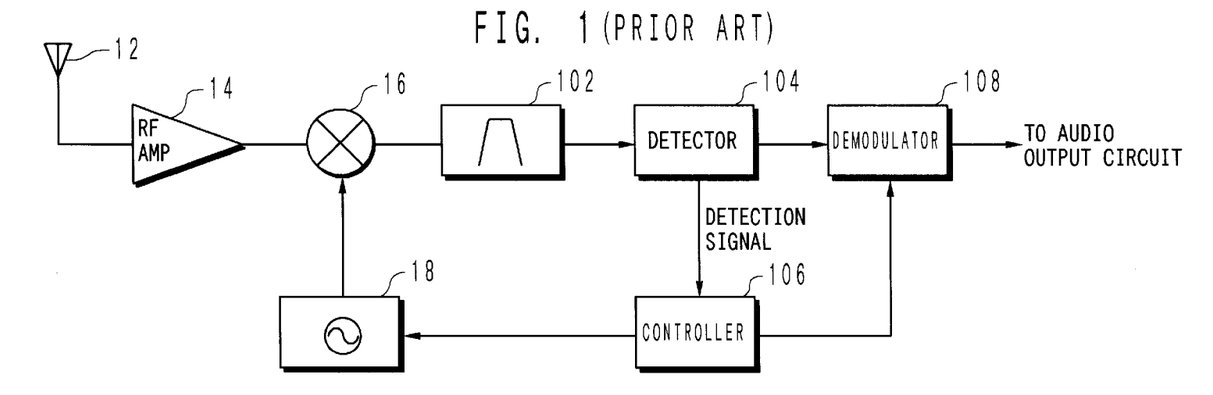
FIG. 1 is a block diagram showing an outline of a conventional wideband receiver.

A wideband receiver which scans a wide frequency band, detects a channel appearing in the frequency band, and according to circumstances, demodulates a signal in the detected channel, and outputs this signal as an acoustic signal has heretofore been known. As shown in FIG. 1, such a wide band receiver comprises, in general, an antenna 12, an RF amplifier 14, a frequency converter 16, a frequency synthesizer 18 consisting of a PLL (Phase Locked Loop) circuit and a voltage controlled oscillator (VCO), a narrow-band filter 102, a detector 104, a control circuit 106 and a demodulation circuit 108.

Radio wave received by the antenna 12 is converted to an intermediate frequency signal by the frequency converter 16 via the RF amplifier 14. This intermediate frequency signal is provided to the detector 104, through the narrow-band filter 102 substantially having a frequency bandwidth, that is, a step width. The detector 104 detects whether a communication signal is included or not in the signal having passed through the narrow-band filter 102, and outputs a detection signal indicating the detection of the communication signal to the control circuit 106. The control circuit 106 responds to, for example, the detection signal, fixes the frequency of the local oscillation signal from the frequency synthesizer 18, controls each circuit so that the detected communication signal is output to the demodulation circuit 108, or changes the frequency of the local oscillation signal, and controls each circuit so that an intermediate frequency signal having other frequency is output from the frequency converter 16.

In this manner, by repeating a processing in which the frequency of the intermediate frequency signal is changed, and a narrow-band filter having a predetermined frequency bandwidth (channel width) filters this signal, and it is detected whether a communication signal is included or not in the filtered signal, signals in communication included in the search frequency range to be searched are detected, and one of these signals can be output in speech or the like.

In the conventional wideband receiver, however, it is required to execute changes of the frequency of the local oscillation signal by the number of channels included in the search frequency range, that is, by (search frequency range/channel width) times. For example, when aeronautical radio having a search frequency range of from 108 MHz–136 MHz, and a frequency bandwidth, i.e., channel width of 25 kHz is to be detected, it is necessary to change the frequency of the local oscillation signal for (24 M/25 k)=960 times. In general, the frequency control time of a frequency synthesizer, that is, the time until the frequency is changed and presence of a predetermined signal is detected is several tens msec. Therefore, iteration of frequency changes and channel search for many times becomes an obstruction in improving the search speed of the receiver.

Moreover, in the conventional wideband receiver, when a certain channel is being detected, it can be only detected whether or not there is a signal in communication in that channel, and the signal in that channel can only be demodulated and output, and detection of a plurality of channels and demodulation and output of a signal at the same time cannot be performed.

It is an object of the present invention to provide a wideband receiver that can detect channels in the search frequency range at a high speed, and can regenerate that signal.

It is another object of the present invention to provide a wideband receiver that can perform detection of a channel and demodulation and output of a signal in that channel or in other channels, at the same time, thereby enabling realization of high-speed search, which is easy to use.

DISCLOSURE OF THE INVENTION

The object of the present invention is achieved by a wideband receiver that receives radio wave, and uses a frequency range allocated to certain broadcasting as a search frequency range to detect a channel being in communication in that search frequency range, comprising: a frequency converter which converts the frequency of a signal input via an antenna, by use of a local oscillation signal from a local oscillator; a wideband filter connected to the frequency converter, which receives the output of the frequency converter to allow a signal component corresponding to a scanning band including a bandwidth of at least a plurality of channels to pass therethrough; an A/D converter connected to the wideband filter, which receives the signal component and converting the signal component to a digital signal; an FFT arithmetic circuit connected to the A/D converter, which receives the digital signal and subjects the signal to a fast Fourier transform; and a detection circuit which detects a channel being in communication in a predetermined scanning band, based on the calculation result by means of the FFT arithmetic circuit; wherein it is constructed such that a frequency of a local oscillation signal is changed to change the scanning band, whereby a channel being in communication is detected in an allocated frequency range.

According to the present invention, a signal corresponding to the scanning band including a bandwidth of a plurality of channels is taken out by a wideband filter. This signal is further subjected to the FFT operation to sequentially calculate a power with respect to the frequency, and a channel being in communication can be detected in the scanning band, by referring to this power. Moreover, according to the present invention, a plurality of channels can be detected by scanning of the scanning band. As a result, the number of times of frequency change of the local oscillation signal and the number of times of frequency transform can be reduced, thereby enabling reduction in the processing time required for scanning of channels.

In a preferred aspect of the present invention, the width of a scanning band of a wideband filter is set to be:

$$I_{bw}/C_{bw} > T_{fft}/T_{ch}+1$$

(wherein $I_{bw}$ is a scanning band width, $C_{bw}$ is a search frequency range, $T_{fft}$ is time for operation in the FFT arithmetic circuit, and $T_{ch}$ is frequency control time of a local oscillator).

In the above aspect, it is more preferable that the left side in the above expression is sufficiently large.

In the more preferable aspect of the present invention, it is so constructed that the wideband receiver comprises a demodulation circuit connected to the A/D converter, which receives a digital signal and demodulates the signal in the detected channel, so that demodulation of a signal in a predetermined channel is realized in parallel with the operation of the FFT arithmetic circuit.

Alternatively, it may be constructed such that the wideband receiver comprises a demodulation circuit connected to the wideband filter, which receives the output from the wideband filter to demodulate a signal in a predetermined channel, so that demodulation of a signal in a predetermined channel is realized in parallel with the operation of the FFT arithmetic circuit. According to these aspects, it becomes possible to realize detection of a channel and demodulation of the detected channel in parallel, in a certain scanning band.

According to another aspect of the present invention, a wideband receiver that receives radio wave, and uses a frequency range allocated to certain broadcasting as a search frequency range to detect a channel being in communication in the search frequency range, comprises: signal extraction means for extracting a signal corresponding to a scanning band corresponding to a search frequency range, or to a scanning band obtained by dividing the search frequency range into at least two; power calculation means for receiving a signal extracted by the signal extraction means and calculating a power with respect to the frequency; and channel detection means for detecting a channel being in communication in the scanning band, based on the calculation result from the power calculation means, wherein a channel being in communication is detected in the search frequency range by changing the scanning band according to need.

In this aspect, it is possible to detect a plurality of channels in the scanning band, and hence the number of times of changing the scanning band can be reduced, thereby enabling reduction in the processing time for channel scanning.

Moreover, the object of the present invention can be achieved by a method comprising steps for realizing the above construction.

DESCRIPTION OF PREFERABLE
EMBODIMENTS OF THE INVENTION

Figure 2:
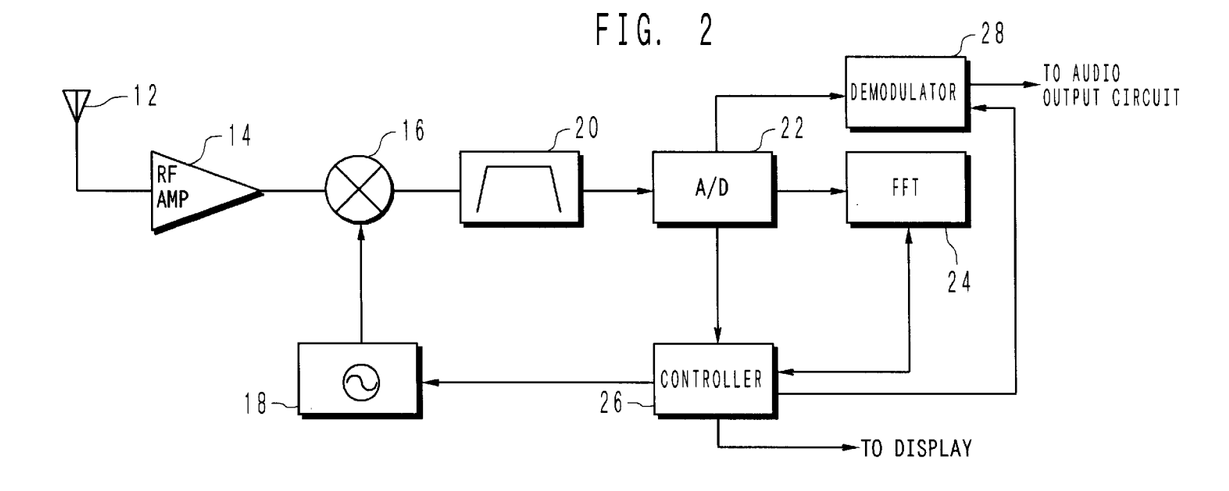
FIG. 2 is a block diagram showing an outline of a wideband receiver according to an embodiment of the present invention.

Embodiments of the present invention will now be described in detail, with reference to the accompanying drawings. FIG. 2 is a block diagram showing hardware of a wideband receiver according to a first embodiment of the present invention. Elements the same as those of the conventional wideband receiver shown in FIG. 1 are denoted by the same numerals. As shown in FIG. 2, a wideband receiver 10 according to this embodiment comprises an antenna 12, an RF amplifier 14, a frequency converter 16, a frequency synthesizer 18 consisting of a PLL circuit and a VCO, a wideband filter 20 having a predetermined IF band, an A/D converter 22, an FFT arithmetic circuit 24, a control circuit 26 for controlling these elements, and a demodulation circuit 28.

In this embodiment, the wideband receiver 10 is capable of detecting narrow FM, commercial FM broadcasting, TV broadcasting or the like. However, in this specification, description will be made, taking an example of detection of aeronautical radio having a frequency bandwidth (channel width) of 25 kHz.

The wideband filter 20 according to this embodiment comprises a passband of 300 kHz. That is to say, the wideband filter 20 is constructed so as to have an IF band of 300 kHz.

Moreover, the A/D converter 22 is to convert an input intermediate frequency signal to digital data at a predetermined sampling frequency (for example, 10 MHz). The FFT arithmetic circuit 24 subjects the input digital data to the fast Fourier transform (FFT) operation to calculate a power level of a frequency component in the IF band regarding the input data. The control circuit 26 controls the operation of the RF amplifier 14 or the demodulation circuit 28, and detects a frequency of the signal being in communication, based on the arithmetic results of the FFT arithmetic circuit 24.

The processing executed by the receiver 10 constructed as described above will be described, with reference to the flowchart in FIG. 3. For example, when the power of the receiver 10 is turned on, the A/D converter 22 and FFT arithmetic circuit 24 are initialized, and the oscillation frequency of the VCO in the frequency synthesizer 18 is also initialized (step 301).

Then, when a user gives an instruction to search, processing of step 302 and after is executed.

Figure 4:
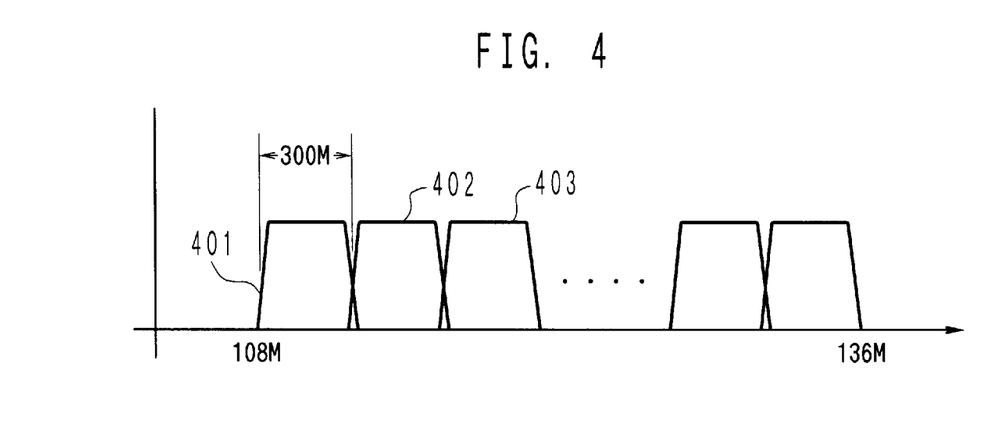
FIG. 4 is a diagram for explaining a band of a signal detected by a BPF in a wideband receiver according to this embodiment.

In this receiver 10, the radio wave received by the antenna 12 is amplified to a predetermined level by the RF amplifier 14, and provided to the frequency converter 16. A local oscillation signal from the VCO in the frequency synthesizer 18 is provided to the frequency converter 16. In this embodiment, by changing the frequency of the local oscillation signal (see step 309 described later), the IF signal output from the frequency converter 16 is filtered by the BPF 20 having a relatively wide band such as 300 kHz, and as shown in FIG. 4, FFT operation is performed for each band of approximately 300 kHz (for example, numeral 401, 402), to thereby detect a channel included in these bands.

In step 302, the frequency converter 16 converts the received radio wave to an intermediate frequency signal, based on the local oscillation signal from the frequency synthesizer 18 (step 302). Then, the intermediate frequency signal is filtered by the BPF 20, and converted to a digital signal by the A/D converter 22. The FFT arithmetic circuit 24 subjects the digital signal output from the A/D converter 22 to the FFT operation (step 303). In the step 303 executed first, the FFT operation is performed with respect to the digital signal corresponding to the band 401 in FIG. 4.

When the FFT operation is completed, the control circuit 26 scans the results of the FFT operation, to judge whether a channel being in communication exists or not (step 304).

For example, if communication in a certain frequency band (channel) is detected (YES in step 304), the control circuit 26 records necessary information such as the frequency thereof in a memory (not shown), and outputs the information to a display unit (not shown) such as a liquid crystal display (step 305). When a user wants to know the communication contents in the frequency band detected in step 304, the user operates a predetermined switch on the receiver 10 (YES in step 306). As a result, the demodulation circuit 28 is operated and a signal in this frequency band is demodulated, and provided to an audio output circuit. In this manner, the communication contents in the detected channel are output in speech (step 307).

On the other hand, when a predetermined switch is not operated by the user (NO in step 306), or during output of the communication contents, the control circuit 26 operates again the results of the FFT operation, to thereby judge whether an other channel being in communication exists or not (step 304). Thereafter, when a channel is detected, processing in step 305 to step 307 is repeated.

In this embodiment, while the control circuit 26 confirms the presence of a channel being in communication by scanning the results of the FFT operation (steps 304 and 305), it is possible to demodulate and output the communication contents of a predetermined channel at the same time, by the audio output circuit. This is because the information (frequency and level) regarding a channel being in communication existing in a predetermined band (in this embodiment, 300 kHz) has been obtained by the FFT arithmetic circuit 24, and hence while the control circuit 26 is obtaining information regarding a certain channel, the demodulation circuit 28 can demodulate a signal in other channels and output the signal to the audio output circuit.

For example, as shown in FIG. 5(a), during reproduction of channel 501, the control circuit 26 can store information regarding a channel 502 or display the information on a display unit. Moreover, unless a user instructs reproduction of communication contents in channel 502, scanning is advanced, and as shown in FIG. 5(b), the control circuit 26 operates to store or display the information regarding channel 503 in the memory or on the display unit. On the other hand, when output of the communication contents in channel 503 is instructed, as shown in FIG. 5(c), a signal in channel 503 is provided to the audio output circuit via the demodulation circuit 28, and the communication contents in channel 503 is output in speech. Furthermore, regardless of the channel during demodulation, scanning is advanced sequentially (for example, channel 504).

When scanning in a predetermined scanning band (300 kHz in this embodiment) is completed (YES in step 308), the control circuit 26 instructs the frequency synthesizer 18 to change the oscillation frequency of the VCO, and in response to this instruction, the frequency synthesizer 18 changes the oscillation frequency of the VCO, and outputs a local oscillation signal of a new frequency (step 309). For example, when the frequency synthesizer 18 outputs a local oscillation signal, so that the frequency converter 16 outputs an intermediate frequency signal to detect the band 401 in FIG. 4, then in step 309, the frequency synthesizer 18 provides a local oscillation signal of a new frequency to the frequency converter 16, so that the frequency converter 16 outputs an intermediate frequency signal to detect the band 402. In this manner, the frequency of the local oscillation signal is changed through step 309, and by repeating steps 302 to 308 again, it becomes possible to subject each of the bands 401 to 40n to the FFT operation to detect a channel that may be included in each band.

Below is a description regarding comparison of the processing time between the receiver 10 according to this embodiment and a conventional receiver. Here, it is assumed that the search frequency range is $S_{bw}$[Hz], the bandwidth of the operation frequency range of a non-search signal, that is, the bandwidth of a channel is $C_{bw}$[HZ], the frequency control time by means of a local oscillator is $T_{ch}$[sec], and the operation time by means of the FFT arithmetic circuit 24 is $T_{fft}$[sec].

Then, in the conventional receiver, the time $T_{sold}$ for searching the search frequency range can be expressed substantially by the following expression (1):

$$T_{sold}=(S_{bw}/C_{bw}) \times T_{ch} \qquad (1).$$

On the other hand, in the receiver according to this embodiment, the time $T_{sfft}$ for searching the search frequency range can be expressed substantially by the following expression (2):

$$T_{sfft}=(S_{bw}/I_{bw}) \times (T_{ch}+T_{fft}) \qquad (2).$$

Therefore, in, order to make the search time of the receiver according to this embodiment smaller than the search time of the conventional receiver, the following expression need only be concluded:

$$T_{sold} > T_{sfft},$$

that is, $$I_{bw}/C_{bw} > T_{fft}/T_{ch}+1 \qquad (3).$$

In particular, in the expression (3), it is preferable that the left side is sufficiently larger than the right side.

A more specific comparative example will be described. For example, in Japan, frequency is allocated to the aeronautical radio, a keymachine of cordless phones and digital car telephones, as shown in Table 1 described below.

TABLE 1

| Band | Frequency | Frequency Band | Step |
|---|---|---|---|
| Aeronautical radio | 108–132 MHz | 24 MHz | 25 kHz |
| Cordless phone Key machine | 380.2125–381.3125 MHz | 1.1 MHz | 12.5 kHz |
| Digital cellular phone | 810.0125–825.9875 MHz | 15.975 MHz | 12.5 kHz |

As is obvious from Table 1, for the aeronautical radio, channels are allocated in the band of 24 MHz of from 108 MHz to 132 MHz with intervals of 25 kHz. Therefore, the number of channels becomes 24 MHz/25 kHz=960. It is considered a case where all the channels are scanned using the conventional receiver. In the case of the conventional wideband receiver (for example, the one of a type of changing over the frequency of PLL as shown in FIG. 1), the time for changing the frequency and detecting the presence of a channel being in communication is approximately 20 msec. That is, since the receiver has a speed of approximately 20 msec per channel, in order to scan all the channels, it requires 20 msec×960=19.6 sec.

On the other hand, if the frequency band (scanning band) to be subjected to the FFT operation is assumed to be 300 kHz, the receiver according to this embodiment obtains a signal by the number of times of 24 MHz/300 kHz=80, and subjects the obtained signal to the FFT operation. For example, in a DSP of one generation before the one currently used (in 1998), in order to execute the FFT operation having a resolution of 25 kHz, being an interval (step) of channels, about 160 μsec will be enough. Therefore, in order to scan all the channels, (20 msec+160 μsec)×λ=1.6 sec will be sufficient. 20 msec in the above expression is a time necessary for changing the frequency, corresponding to the conventional wideband receiver.

As described above, according to this embodiment, comparing with the case where the conventional receiver is used, time of $\frac{1}{12}$ will be enough in order to scan all the channels.

Similarly, comparison regarding the case where all the channels included in the frequency band of the cordless phone and the digital car telephone is shown below, respectively.

1. Cordless Phone Conventional receiver: (1.1 MHz/12.5 kHz)×20 msec=1.76 sec. This embodiment: (1.1 MHz/300 kHz)×(500 μsec+20 msec)≠75 msec.

Here, 500 μsec is a time required for performing the FFT operation having a resolution of 12.5 kHz by the DSP, and 20 msec in the following expression is a time required for changing the frequency of a local oscillation signal.

2. Digital Cellular Phone Conventional receiver: (15.975 MHz/12.5 kHz)×20 msec=25.56 sec. This embodiment: (15.975 MHz/300 kHz) ×(500 μsec+20 msec)≠1.091 sec.

As described above, in the both cases, it can be seen that the receiver according to this embodiment requires a time of approximately 1/23.5 of the conventional receiver, as the time required for scanning.

As described above in detail, according to this embodiment, with respect to an intermediate frequency signal, a frequency band containing at least a plurality of channels is taken out, the signal in the frequency band is subjected to the FFT operation and a channel included in the frequency range is detected. Moreover, an optional channel in the necessary search frequency range can be detected by changing the frequency band to be taken out. Therefore, it becomes possible to reduce the processing time for detection, by adjusting the frequency bandwidth, and reducing the number of times of changing the frequency band, which needs time. Furthermore, if it is in the same frequency band, communication contents in other channels can be reproduced, while detecting a channel.

Needless to say, the present invention is not limited to the above embodiment, and various modifications are possible within the scope of the present invention described in claims, which are included in the scope of the present invention.

Figure 5:
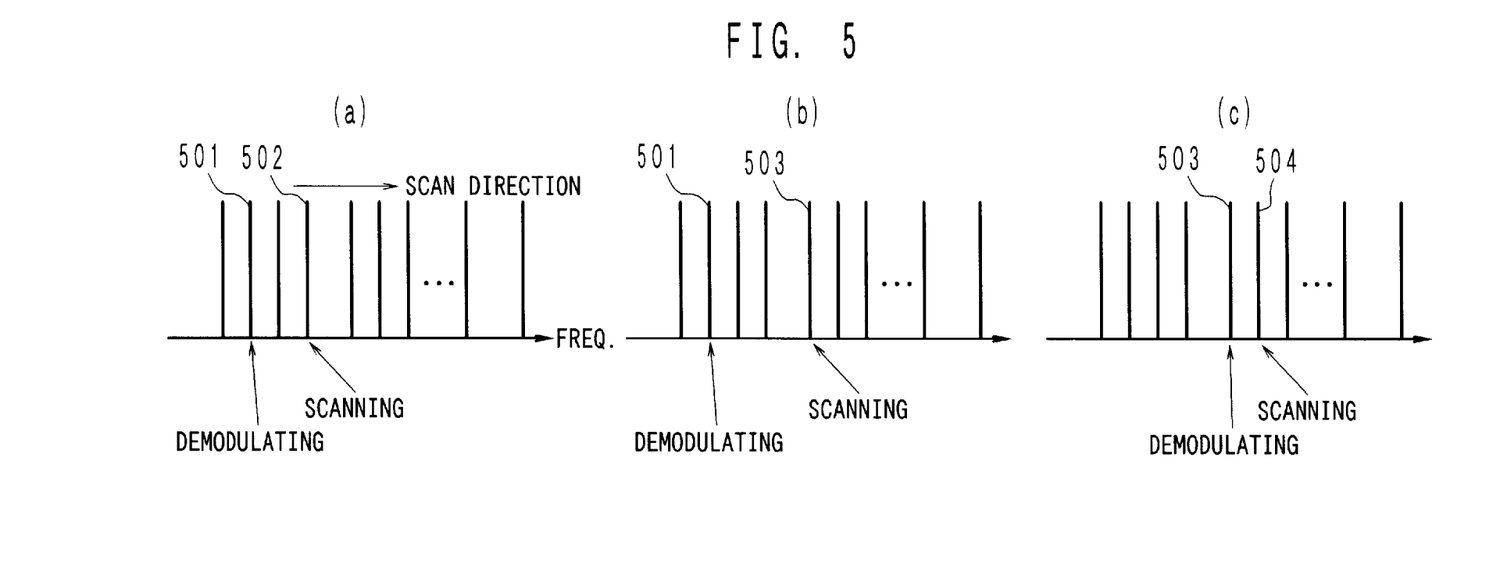
FIGS. 5(a) to 5(c) are diagrams for explaining relation between a channel now being scanned and a channel being demodulated in this embodiment.
Figure 6:
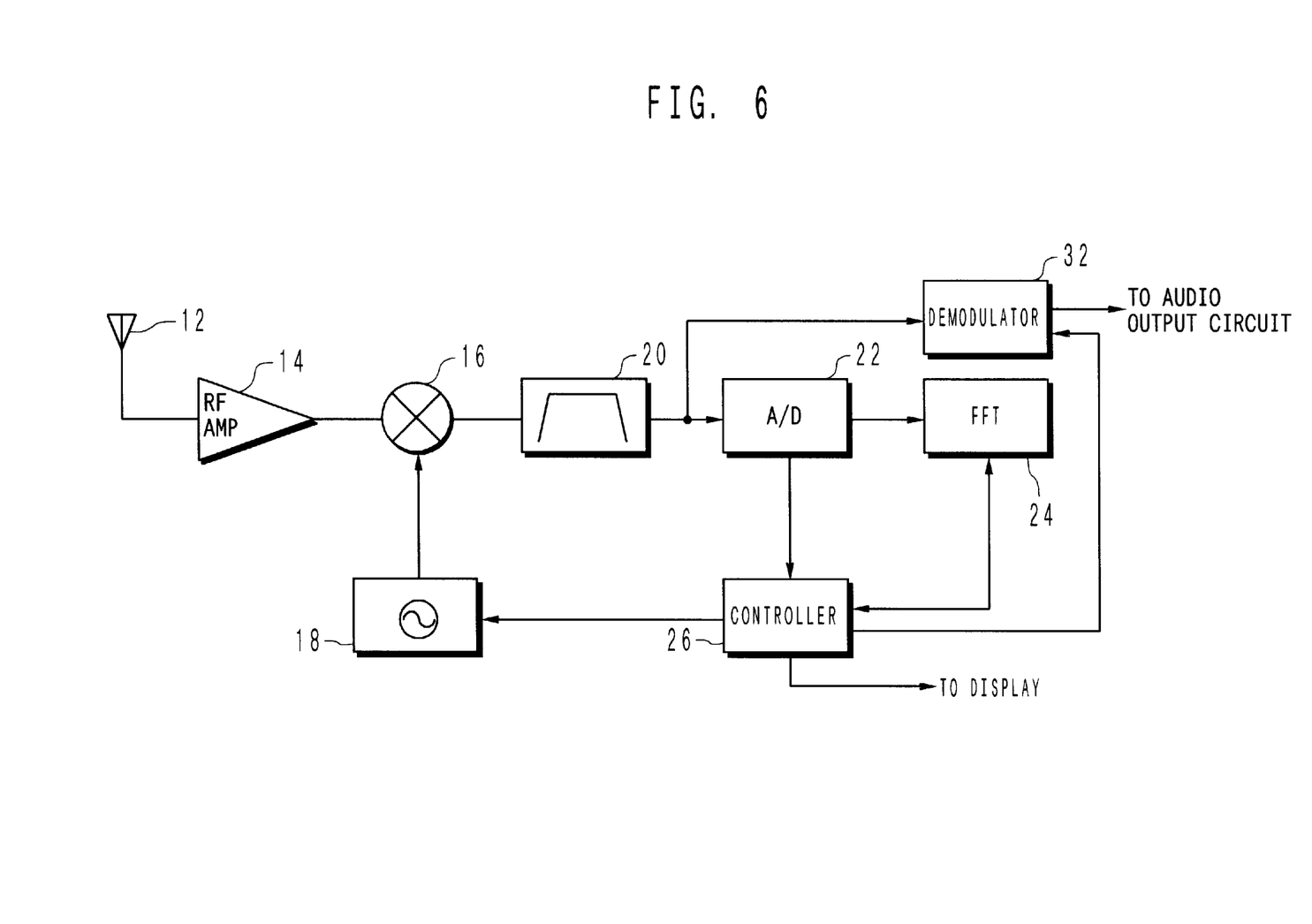
FIG. 6 is a block diagram showing an outline of a wideband receiver according to another embodiment of the present invention.

For example, in the above embodiment, the demodulation circuit 28 is constructed so as to receive the digital output from the A/D converter 22, demodulate a signal from a predetermined channel, and provide the demodulated signal to the audio output circuit. In this case, the FFT arithmetic circuit 24 and the demodulation circuit 28 can be realized by a single DSP (Digital Signal Processor). However, the present invention is not limited thereto, and as shown in FIG. 5, instead of the demodulation circuit 28, there may be provided an analog demodulation circuit 32 for receiving an analog output of the wideband filter 20 and demodulating a selected predetermined channel.

Also in the above embodiment, the wideband filter 20 has a bandwidth of 300 kHz, but the bandwidth is not limited thereto, and may be properly set, considering nyquist interval, the number of samples to be calculated by the FFT arithmetic circuit 24 or the like. Alternatively, if it is possible, a wideband filter, which allows to pass through the search frequency range, may be arranged. In this case, the search frequency range itself may be designated as the scanning band, and in FIG. 3, it becomes possible to detect a channel in the search frequency range, without changing the local oscillation signal by the frequency synthesizer.

Needless to say, the sampling frequency in the A/D converter 22 is not limited to the one described in the above embodiment, and at least twice the size of the bandwidth of non-sampling signals is sufficient. For example, if a signal input to the A/D converter is 10.7 MHz±150 kHz, it is only necessary that the sampling frequency of at least twice the size of the bandwidth, that is, 600 kHz or higher, and the frequency property of not lower than 10.7 MHz are ensured.

Figure 3:
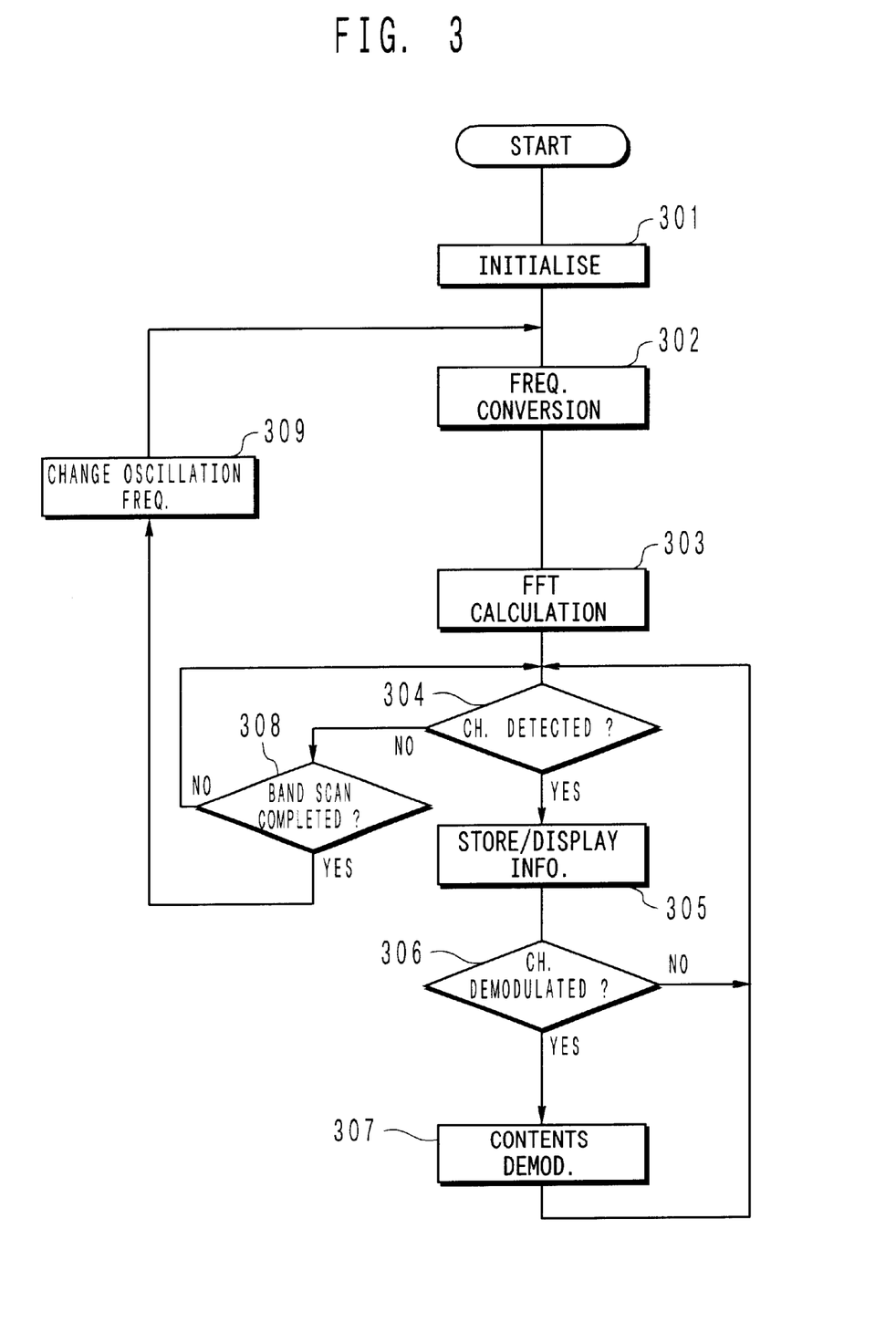
FIG. 3 is a flowchart showing an outline of processing executed by a wideband receiver according to this embodiment.
Figure 7:
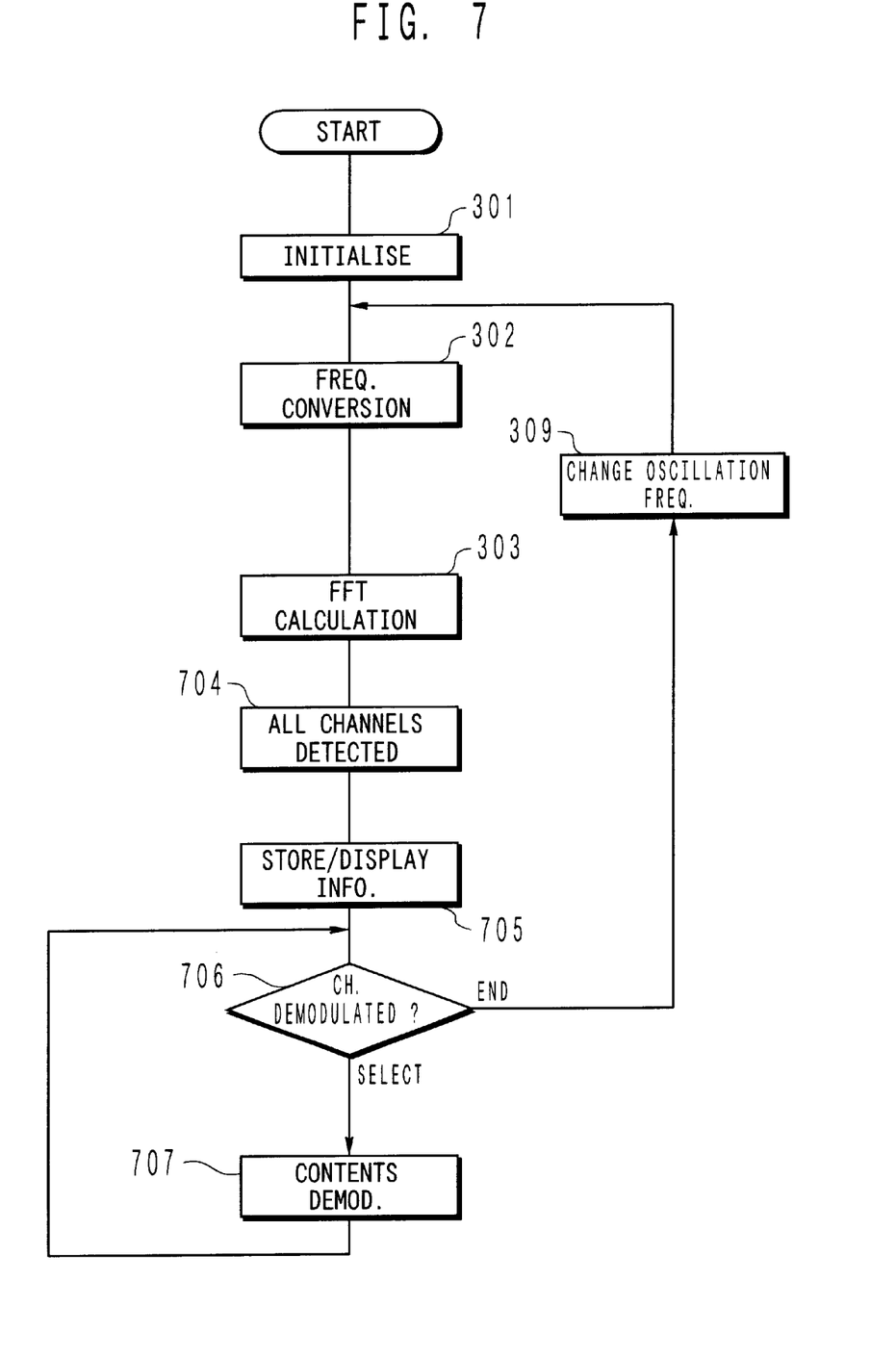
FIG. 7 is a flowchart showing a processing executed by a wideband receiver according to the other embodiment of the present invention.

Moreover, in the above embodiment, as shown in FIG. 3, it is constructed such that when a channel is detected, in response to an instruction to demodulate the channel (step 306), a signal in a specified channel is demodulated (step 307), and at the same time, other channels are scanned (step 304). As a result, while performing demodulation and output, detection of other channels can be performed, thereby enabling reduction in the processing time. However, the present invention is not limited to the above processing. FIG. 7 shows another embodiment of the processing. In FIG. 7, the same processing steps as those in FIG. 3 are denoted by the same numerals. As shown in FIG. 7, all the channels being in communication are detected in the scanning band (step 704), and information regarding the channels is displayed on a screen of a display unit, and the information is stored in a memory (step 705). When a user selects a certain channel, the demodulation circuit 28 demodulates the channel and provides a signal to the audio output circuit. It is a matter of course that other processing forms may be taken.

In this embodiment, a signal demodulated by the demodulation circuit is provided to the audio output circuit and the communication contents are output in speech. However, the construction is not limited thereto, and the communication contents may be output to the display unit.

Moreover, in this specification, means do not always stand for a physical means, and include a case where the function of each means is realized by software. Furthermore, a function of one means may be realized by two or more physical means, or functions of two or more means may be realized by one physical means.

INDUSTRIAL APPLICABILITY

With the present invention, broadcasting, in which a predetermined frequency range is allocated for aeronautical radio and digital cellular phones, including narrow FM, commercial FM broadcasting and TV broadcasting, and a plurality of channels are allocated in the allocated frequency range, that is, frequency band in a certain step, is scanned to detect a channel being in communication, and the contents can be output. Therefore, the present invention is applicable to the receivers and transmitters.

What is claimed is:

1. A wideband receiver that receives radio wave, and uses a frequency range allocated to certain broadcasting as a search frequency range to detect a channel being in communication in said search frequency range, comprising:

a frequency converter which converts the frequency of a signal input via an antenna, by use of a local oscillation signal from a local oscillator;

a wideband filter connected to said frequency converter, which receives the output of said frequency converter to allow a signal component corresponding to a scanning band including a bandwidth of at least a plurality of channels to pass therethrough;

an A/D converter connected to said wideband filter, which receives said signal component and converts the signal component to a digital signal;

an FFT arithmetic circuit connected to said A/D converter, which receives said digital signal and subjects the signal to a fast Fourier transform;

a detection circuit which sequentially detects one or more channels being in communication in a predetermined scanning band, based on the calculation result by means of said FFT arithmetic circuit, and outputting the detection results;

a demodulation circuit which demodulates and outputs a signal in a predetermined channel being in communication; and a control circuit which specifies a channel being in communication sequentially detected by said detection circuit, according to a predetermined instruction, and allows the demodulation circuit to demodulate a signal in the specified channel;

wherein said receiver is constructed such that while said demodulation circuit demodulates and outputs a signal in the specified channel, said detection circuit operates for the detection of the remaining channels, in parallel with the demodulation by means of said demodulation circuit, and a frequency of said local oscillation signal is changed to change said scanning band, whereby a channel being in communication is detected in an allocated frequency range.

2. A wideband receiver according to claim 1, wherein the width of the scanning band of said wideband filter is set to be:

$$I_{bw}/C_{bw} > T_{fft}/T_{ch}+1$$

(wherein $I_{bw}$ is a scanning band width, $C_{bw}$ is a search frequency range, $T_{fft}$ is time for operation in the FFT arithmetic circuit, and $T_{ch}$ is frequency control time of a local oscillator).

3. A wideband receiver according to claim 1 or 2, wherein said demodulation circuit is connected to said A/D converter, and receives said digital signal to demodulate a signal in the detected channel, so that demodulation by means of the demodulation circuit is realized in parallel with the detection of the channel.

4. A wideband receiver according to claim 1 or 2, wherein said demodulation circuit is connected to said wideband filter, and receives the output from said wideband filter to demodulate a signal in a predetermined channel, so that demodulation by means of the demodulation circuit is realized in parallel with the detection of the channel.

5. A wide band receiver that receives radio wave, and uses a frequency range allocated to certain broadcasting as a search frequency range to detect a channel being in communication in said search frequency range, comprising:

signal extraction means for extracting a signal corresponding to a scanning band corresponding to a search frequency range, or a scanning band obtained by dividing the search frequency range into at least two;

power calculation means for receiving a signal extracted by said signal extraction means and calculating a power with respect to the frequency;

channel detection means for sequentially detecting one or more channels being in communication in the scanning band, based on the calculation result from said power calculation means;

a demodulation circuit for demodulating and outputting a signal of a predetermined channel being in communication; and a control circuit for specifying a channel being in communication sequentially detected by said detection circuit, according to a predetermined instruction, and allowing the demodulation circuit to demodulate a signal in the specified channel;

wherein the receiver is constructed such that while said demodulation circuit demodulates and outputs a signal in the specified channel, said detection circuit operates for the detection of the remaining channels, in parallel with the demodulation by means of said demodulation circuit, and a channel being in communication is detected in the search frequency range by changing said scanning band according to need.

6. A channel scanning method for receiving radio wave, using a frequency range allocated to certain broadcasting as a search frequency range to detect a channel being in communication in said search frequency range, and demodulating and outputting a signal in a predetermined channel, which is constructed to perform steps of:

converting the frequency of a signal input via an antenna, by a local oscillation signal from a local oscillator;

allowing a signal component corresponding to a scanning band including a bandwidth of at least a plurality of channels to pass, among intermediate frequency signals obtained by the frequency conversion;

calculating a power with respect to the frequency of said signal component;

sequentially detecting one or more channels being in communication in said scanning band, based on the power obtained by said calculation;

specifying the sequentially detected channel being in communication in accordance with a predetermined instruction;

detecting remaining channels being in communication in parallel with demodulation and output of a signal in said specified channel; and repeating conversion of the frequency of said local oscillation signal and changing the scanning band, to detect channels being in communication in the frequency range, and demodulating and outputting a signal in the specified channel.

7. A method according to claim 6, wherein the width of the scanning band of said wideband filter is set to be:

$$I_{bw}/C_{bw} > T_{fft}/T_{ch}+1$$

(wherein $I_{bw}$ is a scanning band width, $C_{bw}$ is a search frequency range, $T_{fft}$ is time for operation in the FFT arithmetic circuit, and $T_{ch}$ is frequency control time of a local oscillator).

8. A channel scanning method for receiving radio wave, using a frequency range allocated to certain broadcasting as a search frequency range to detect a channel being in communication in said search frequency range, and demodulating and outputting a signal in a predetermined channel, comprising steps of:

converting the frequency of a signal input via an antenna, by a local oscillation signal from a local oscillator;

obtaining a scanning range by dividing a search frequency range into at least two, when necessary;

extracting a signal corresponding to the scanning band;

calculating a power of the extracted signal with respect to the frequency;

sequentially detecting one or more channels being in communication in said scanning band, based on the calculated power;

specifying the sequentially detected channel being in communication in accordance with a predetermined instruction;

detecting remaining channels being in communication in parallel with demodulation and output of a signal in said specified channel; and repeating conversion of the frequency of said local oscillation signal and changing the scanning band, to detect channels being in communication in the frequency range, and demodulating and outputting a signal in the specified channel.

* * * * *

UNITED STATES PATENT AND TRADEMARK OFFICE
CERTIFICATE OF CORRECTION

PATENT NO.    : 6,816,715 B1
DATED         : November 9, 2004
INVENTOR(S)   : Hiroshi Mano It is certified that error appears in the above-identified patent and that said Letters Patent is hereby corrected as shown below:

Column 1,
Line 19, delete "wide band" and insert -- wideband --.

Column 7,
Line 5, delete "$\lambda$" and insert -- 80 --.
Lines 18 and 28, delete "$\neq$" and insert -- $\simeq$ --.

Signed and Sealed this

Third Day of May, 2005

JON W. DUDAS
*Director of the United States Patent and Trademark Office*